US007852254B1

(12) United States Patent
Ginetti

(10) Patent No.: US 7,852,254 B1
(45) Date of Patent: Dec. 14, 2010

(54) 1-BIT CELL CIRCUIT USED IN A PIPELINED ANALOG TO DIGITAL CONVERTER

(75) Inventor: Bernard Ginetti, Antibes (FR)

(73) Assignee: Mstar Semiconductor, Inc., Hsinchu Hsien (TW)

( * ) Notice: Subject to any disclaimer, the term of this patent is extended or adjusted under 35 U.S.C. 154(b) by 72 days.

(21) Appl. No.: 12/489,778

(22) Filed: Jun. 23, 2009

(51) Int. Cl.
*H03M 1/12* (2006.01)

(52) U.S. Cl. ...................................... 341/172; 341/161

(58) Field of Classification Search ................ 341/161, 341/162, 163, 172
See application file for complete search history.

(56) References Cited

U.S. PATENT DOCUMENTS 5,764,176 A * 6/1998 Ginetti ...................... 341/161
6,437,720 B1 * 8/2002 Yin et al. .................... 341/150
6,573,850 B1 * 6/2003 Pennock ..................... 341/150
7,148,834 B2 * 12/2006 da Fonte Dias ............. 341/162
7,812,753 B1 * 10/2010 Myles et al. ................ 341/144
7,821,433 B2 * 10/2010 Abe .......................... 341/118
2009/0115523 A1 * 5/2009 Akizuki et al. ............. 341/155

* cited by examiner

*Primary Examiner*—Howard Williams
(74) *Attorney, Agent, or Firm*—Ming Chow; Sinorica, LLC

(57) ABSTRACT

The present invention discloses a 1-bit cell circuit used in a pipelined analog to digital converter. The 1-bit cell circuit comprises a reference buffer for providing a reference voltage; a sample and charge transfer circuit for receiving an input signal to generate an output signal; and a dump circuit for dumping said reference voltage; wherein said reference buffer selectively connects to one of said sample and charge transfer circuit and said dump circuit according to said input signal.

15 Claims, 9 Drawing Sheets

1-BIT CELL CIRCUIT USED IN A PIPELINED ANALOG TO DIGITAL CONVERTER

BACKGROUND OF THE INVENTION

1. Field of the Invention

The present invention relates to pipelined ADCs, and more particularly to a 1-bit cell circuit used in pipelined ADCs.

2. Description of the Related Art

In mixed modes circuits, ADC (Analog-Digital-Converter) is an inevitable part. Recently, pipelined ADC is widely adopted due to its concise structure and superior performance. Please refer to FIG. 1, which shows the typical architecture of a prior art 1-bit cell of a pipelined ADC. The 1-bit cell has a sampling phase and a charge transfer phase during a clock cycle. As shown in FIG. 1, the 1-bit cell includes an OTA (Operational Transconductance Amplifier) 101, four matched capacitors 102~105, a first set of switches 106~113, a second set of switches 114~121, two multiplexers 122 and 123, and two latched comparators 124 and 125.

The OTA 101 is used to generate a residue output Vout according to an input signal Vin, wherein the residue output Vout is composed of a positive output Voutp and a negative output Voutn, and the input signal Vin is composed of a positive input signal Vinp and a negative input signal Vinn. The matched capacitors 102~105 are used to hold a sampled voltage of the input signal Vin. The first set of switches 106~113 are closed for sampling the input signal Vin during the sampling phase. The second of switches 114~121 are closed during the charge transfer phase to make the matched capacitors 102~105 and the OTA 101 form a negative feedback circuit to generate the residue output Vout. The two multiplexers 122 and 123 are used to respectively provide a first multiplexer output voltage and a second multiplexer output voltage which are selected from a group consisting of a negative reference voltage Vrefn, a positive reference voltage Vrefp and a ground voltage according to two select signals bp and bn, wherein bp is a positive bit signal and bn is a negative bit signal. When bp=0 and bn=0, the first multiplexer output voltage and the second multiplexer output voltage are both connected to the ground voltage; when bp=0 and bn=1, the first multiplexer output voltage is connected to the negative reference voltage Vrefn and the second multiplexer output voltage is connected to the positive reference voltage Vrefp; and when bp=1 and bn=0, the first multiplexer output voltage is connected to the positive reference voltage Vrefp and the second multiplexer output voltage is connected to the negative reference voltage Vrefn. The comparator 124 is used to generate the positive bit signal bp according to voltage comparison of the input signal Vin and a first reference voltage Vref/4, and the comparator 125 is used to generate the negative bit signal bn according to voltage comparison of the input signal Vin and a second reference voltage −Vref/4, wherein the Vref is equal to the voltage difference between the Vrefp and the Vrefn. When Vin is between −Vref/4 and Vref/4, (bp, bn) is (0,0); when Vin is smaller than −Vref/4, (bp, bn) is (0,1); and when Vin is greater than Vref/4, (bp, bn) is (1,0).

During the sampling phase, the input signal Vin is sampled and hold, and the positive bit signal bp and the negative bit signal bn are generated. Please refer to FIG. 2*a*, which shows an illustrating diagram of the sampling phase of the prior art 1-bit cell. As shown in FIG. 2*a*, the top plates of the capacitor 102 and the capacitor 103 are connected to the positive terminal of the Vin, and the top plates of the capacitor 104 and the capacitor 105 are connected to the negative terminal of the Vin, and all the bottom plates of the capacitors 102, 103, 104 and 105 are connected to the ground. The comparator 124 and 125 respectively generates the positive bit signal bp and the negative bit signal bn for the charge transfer phase.

During the charge transfer phase, the residue output is generated. Please refer to FIG. 2*b*, which shows an illustrating diagram of the charge transfer phase of the prior art 1-bit cell. As shown in FIG. 2*b*, due to the virtual ground of the OTA 101 in negative feedback, there will be charge drawn from the Vref, flowing through the capacitors 102~105 to generate the residue output Vout=2×Vin−(bp−bn)×Vref.

However, as the Vin is a varying signal, the charge delivered by the Vref will be different. That is, the loading of the Vref will be varying and dependent on the input signal Vin. The total amount of charge Q taken from the Vref by each 1-bit cell can be easily computed as being the capacitance of the capacitor 102, the capacitor 104 times the voltage difference between the final voltage appearing on the capacitor 102, the capacitor 104 at the end of the charge transfer phase, and the voltage appearing on the capacitor 102, the capacitor 104 at the beginning of the charge transfer phase. For a first order analysis, assuming complete settling at each clock phase, and neglecting any mismatch between the positive and negative channels of the differential architecture, e.g. consider the capacitance of the capacitor 102=Csp, the capacitance of the capacitor 104=Csn, and Csp=Csn=Cs. The total amount of charge Q is derived according to bit decision as follows:

$$\text{for } b=+1(bp=1\&bn=0),\ Q=Csp*(Vrefp-Vinp)=-Csn*(Vrefn-Vinn)=Cs*(Vref-Vin)/2;$$

$$\text{for } b=-1(bp=0\&bn=1),\ Q=Csn*(Vrefp-Vinn)=Csp(Vrefn-Vinp)=Cs*(Vref+Vin)/2;\ \text{and}$$

$$\text{for } b=0(bp=0\&bn+0),\ Q=0.$$

The minimal input voltage Vin yielding a positive bit decision (b=+1) is Vref/4, and the maximal amount of charge thereof arises to: Q,max=Cs*(Vref−Vref/4)/2=3*Cs*Vref/8=0.375*Vref. The negative (b=−1) bit decision yields the same maximal value for Q (the input signal Vin gets the opposite value, and the connection of the capacitor 102, the capacitor 104 to the reference voltage Vref are cross-swapped). Since there is no load at all applied on the reference voltage Vref for a null bit decision (b=0), the total variation (with the input signal Vin) of the charge taken from the reference voltage Vref is thus: Q,var=Q,MAX−0=0.375*Cs*Vref.

Since the loading of the reference voltage Vref depends on the input signal Vin, complete settling of voltage on the sampling capacitor is then needed to prevent sampling noise. However, this implies a longer sampling time. If high speed is required, then more power has to be burned on the reference voltage buffer to shorten the settling time.

Therefore, there is a need to provide a solution capable of reducing the power consumption and eliminating the need of full settling of the voltage on the sampling capacitor charged by a voltage reference.

To overcome the drawback, the present invention proposes a novel topology of signal independent voltage reference loading for the pipelined ADC.

SUMMARY OF THE INVENTION

One objective of the present invention is to provide a signal independent voltage reference loading circuit to construct a concise and power saving pipelined ADC.

Another objective of the present invention is to provide a signal independent voltage reference loading circuit to release the speed requirement of the voltage reference buffer.

Still another objective of the present invention is to provide a signal independent voltage reference loading circuit to construct a 4× interleaved pipelined ADC.

To achieve the foregoing objectives, the present invention provides a 1-bit cell circuit used in a pipelined analog to digital converter, having a sampling phase including a first half period and a second half period and a charge transfer phase in a cycle. The 1-bit cell circuit comprises a differential amplifier, having a positive input end, a negative input end, a positive output end and a negative output end, for outputting a residue output signal; a first capacitor, having a first plate and a second plate, and a second capacitor, having a third plate and a fourth plate, wherein said first plate is connected to a positive input signal, said third plate is connected to a negative input signal, and said second plate and said fourth plate are both connected to an input common mode reference ground during said sampling phase, and said first plate is connected to said third plate, said second plate is connected to said negative input end of said differential amplifier, and said fourth plate is connected to said positive input end of said differential amplifier during said charge transfer phase; and a third capacitor, having a fifth plate and a sixth plate, and a fourth capacitor, having a seventh plate and an eighth plate, wherein said fifth plate and said seventh plate are connected to an output common mode reference ground, and said sixth plate and said eighth plate are both connected to said input common mode reference ground during said first half period of said sampling phase; said fifth plate is connected to a first reference contact, said seventh plate is connected to a second reference contact, and said sixth plate and said eighth plate are both connected to said input common mode reference ground during said second half period of said sampling phase; and said fifth plate is connected to said positive output end of said differential amplifier, said sixth plate is connected to said negative input end of said differential amplifier, said seventh plate is connected to said negative output end of said differential amplifier and said eighth plate is connected to said positive input end of said differential amplifier during said charge transfer phase; wherein voltages of said first reference contact and said second reference contact are determined according to an input voltage and a reference voltage, and said input voltage is a voltage difference between said positive input signal and said negative input signal.

In addition, according to another embodiment of the present invention, a 1-bit cell circuit is used in a pipelined analog to digital converter, having a sampling phase including a first half period and a second half period and a charge transfer phase in a cycle. The 1-bit cell circuit comprises a differential amplifier, having a pair of differential input ends and a pair of differential output ends, for outputting a differential residue output signal; a first pair of capacitors, having a pair of first top plates and a pair of first bottom plates, wherein said pair of first top plates are connected to a differential input signal, and said first bottom plates are connected to an input common mode reference ground during said sampling phase, and said first top plates are connected to each other and said first bottom plates are connected to said differential input ends of said differential amplifier during said charge transfer phase; and a second pair of capacitors, having a pair of second top plates and a pair of second bottom plates, wherein said second top plates are connected to an output common mode reference ground and said second bottom plates are connected to an input common mode reference ground during said first half period of said sampling phase; said second top plates are connected to a pair of reference contacts and said second bottom plates are connected to said input common mode reference ground during said second half period of said sampling phase; and said second top plates are connected to said differential output ends of said differential amplifier and said second bottom plates are connected to said differential input ends of said differential amplifier during said charge transfer phase; wherein voltages of said reference contacts are determined according to an input voltage of said differential input signals and a reference voltage.

In addition, according to another embodiment of the present invention, a 1-bit cell circuit is used in a pipelined analog to digital converter. The 1-bit cell circuit comprises a reference buffer for providing a reference voltage; a sample and charge transfer circuit for receiving an input signal to generate an output signal; and a dump circuit for dumping said reference voltage; wherein said reference buffer selectively connects to one of said sample and charge transfer circuit and said dump circuit according to said input signal.

To make it easier for our examiner to understand the objective of the invention, its structure, innovative features, and performance, we use a preferred embodiment together with the accompanying drawings for the detailed description of the invention.

DETAILED DESCRIPTION OF THE PREFERRED EMBODIMENTS

The present invention will be described in more detail hereinafter with reference to the accompanying drawings that show the preferred embodiment of the invention.

Figure 1:
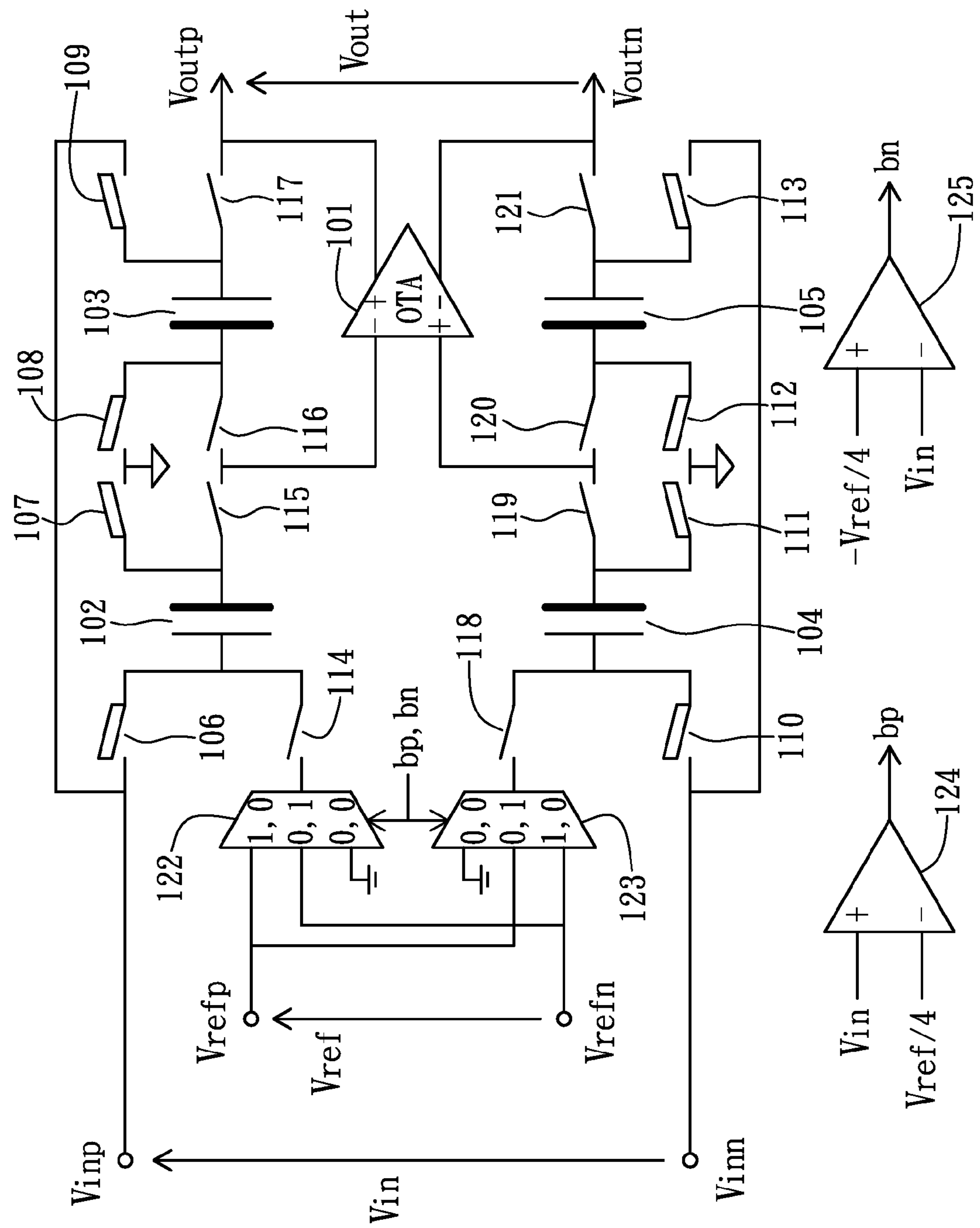
FIG. 1 is the typical architecture of a prior art 1-bit cell of a pipelined ADC.
Figure 2A:
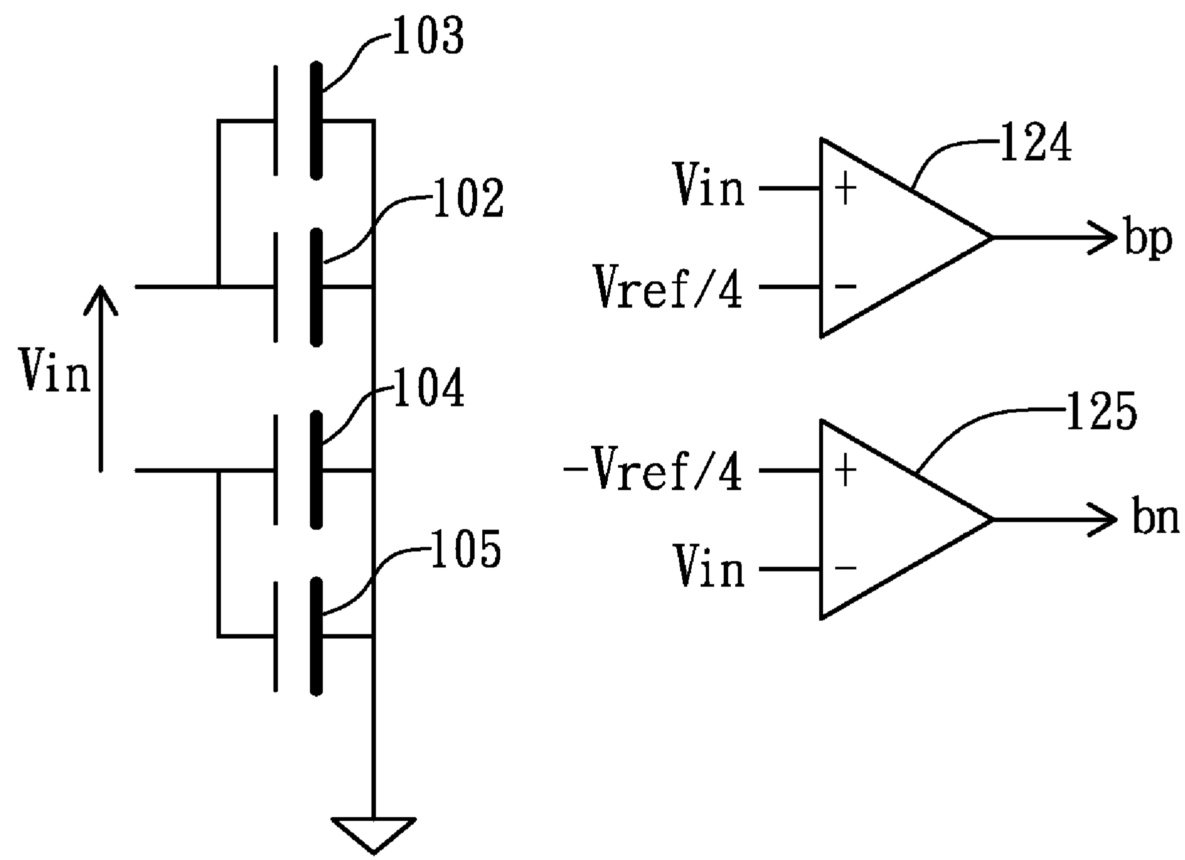
FIG. 2*a* is an illustrating diagram of sampling phase of the prior art 1-bit cell.
Figure 2B:
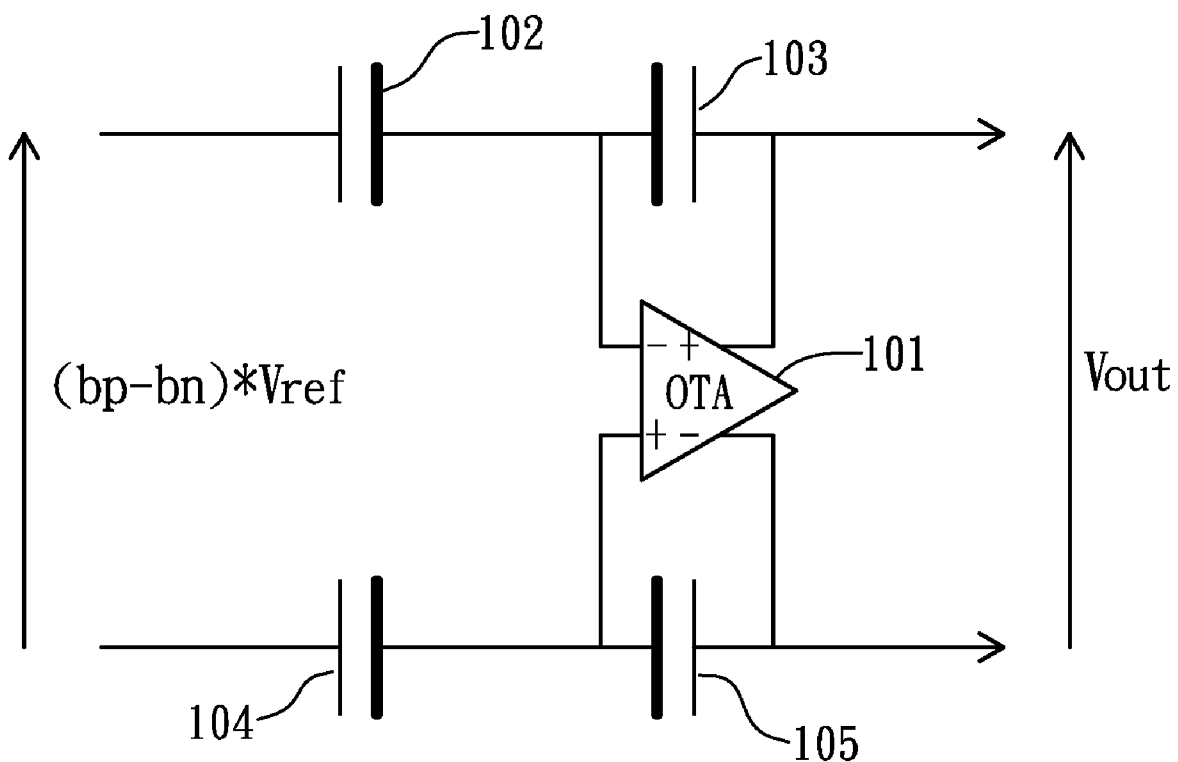
FIG. 2*b* is an illustrating diagram of charge transfer phase of the prior art 1-bit cell.
Figure 3A:
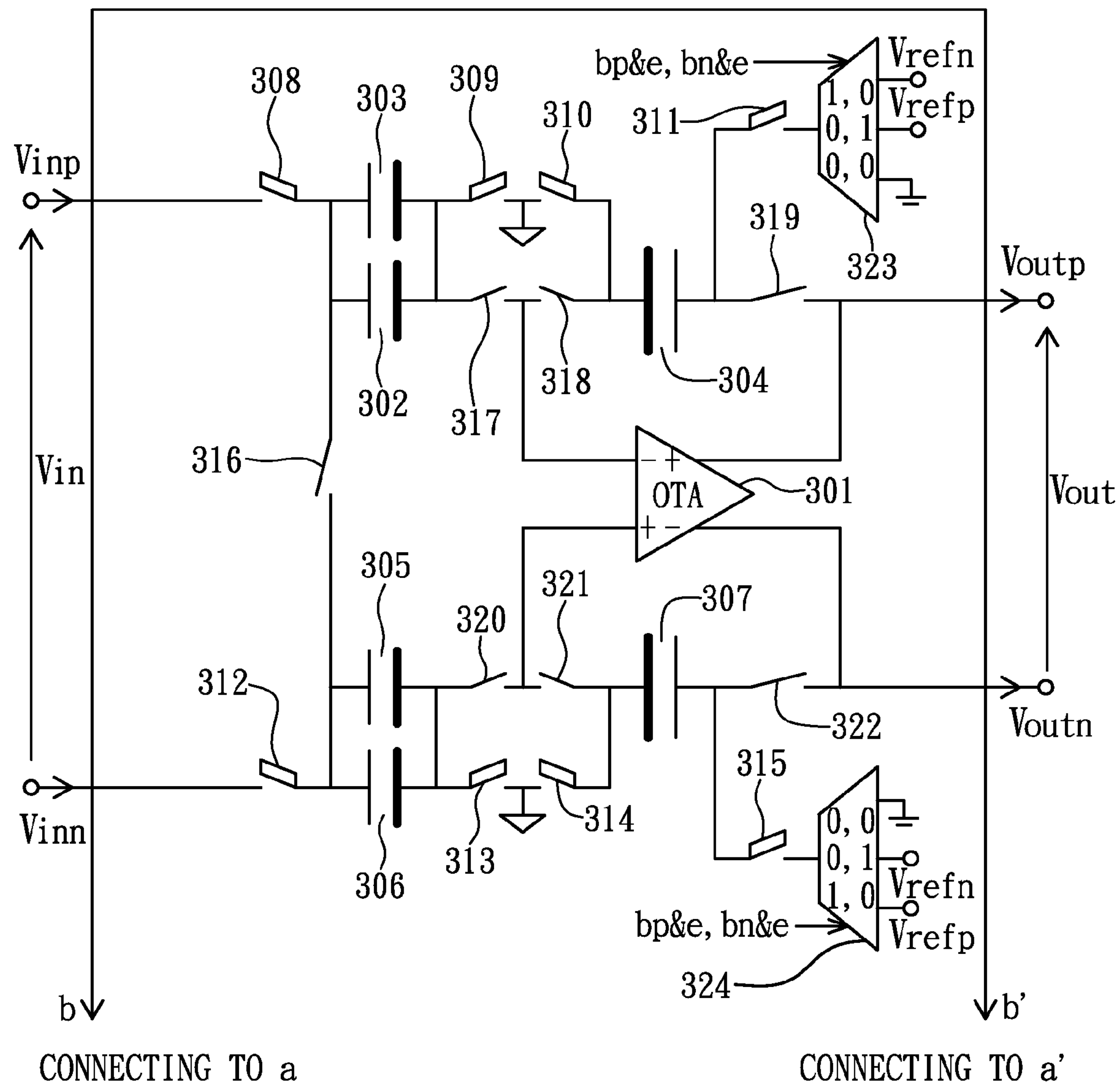
FIG. 3 is the circuit diagram of a 1-bit cell using a signal independent voltage reference loading circuit according to a preferred embodiment of the present invention.
Figure 3B:
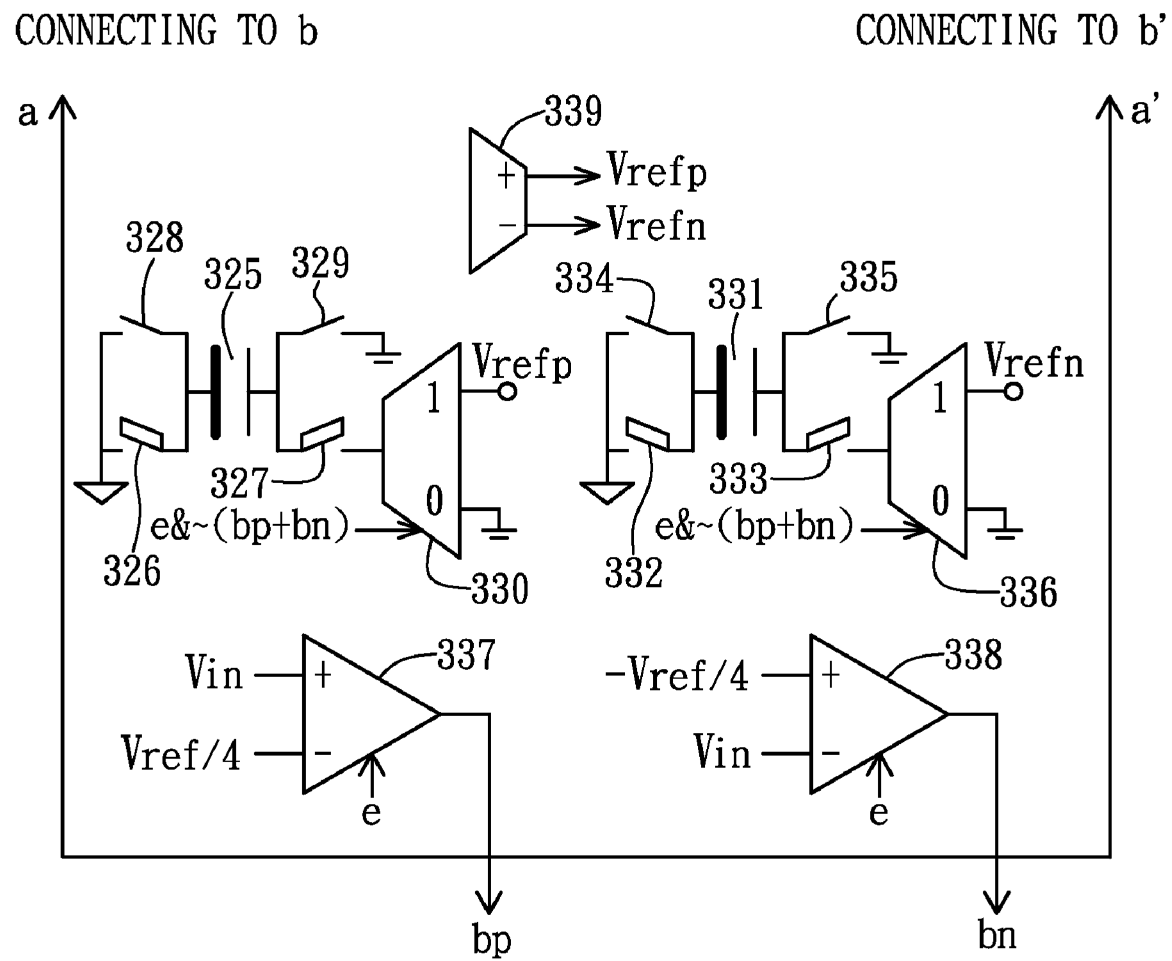

Please refer to FIG. 3*a*~*b*, which shows the circuit diagram of a 1-bit cell using a signal independent voltage reference loading circuit according to a preferred embodiment of the present invention. The 1-bit cell ADC procedure includes a first half period of sampling phase, a second half period of sampling phase and a charge transfer phase during a converting period. As shown in FIG. 3*a*, the 1-bit cell ADC serve as a sample and charge transfer circuit comprises an OTA (Operational Transconductance Amplifier) 301, six matched capacitors 302~307, eight sampling phase switches 308~315, seven charge transfer phase switches 316~322, two multiplexers 323 and 324, two comparators 337 and 338 and a voltage reference buffer 339. As shown in FIG. 3*b*, a dump circuit comprises two multiplexers 330 and 336, two matched capacitors 325 and 331, four sampling phase switches 326~327 and 332~333, and four charge transfer phase switches 328~329 and 334~335.

In the 1-bit cell circuit, the OTA 301, having a positive input end, a negative input end, a positive output end and a negative output end, is used to generate a residue output $V_{out}$ according to an input signal $V_{in}$, wherein the residue output $V_{out}$ is composed of a positive output $V_{outp}$ and a negative output $V_{outn}$, and the input signal $V_{in}$ is composed of a positive input signal $V_{inp}$ and a negative input signal $V_{inn}$.

The eight matched capacitors 302~307, 325 and 331 are implemented to function as follows. In the circuit, the capacitors 302, 303 can be viewed as a first capacitor and the capacitors 305, 306 can be viewed as a second capacitor. The first capacitor and the second capacitor can be viewed as a first pair of capacitors; the capacitors 304, 307 can be viewed as a second pair of capacitors; and the capacitors 325, 331 can be viewed as a third pair of capacitors, wherein the first pair of capacitors are used to hold the sampled voltage of the input signal, and the second pair of capacitors are used to hold the sampled voltage of a differential voltage, which is selected from one of a reference voltage and an output common mode reference ground, and the third pair of capacitors are used to serve as a dump circuit for the reference voltage when the reference voltage is not selected to charge the second pair of capacitors. The first capacitor, composed of capacitors 302 and 303, both implemented according to a predetermined capacitance, is used to hold a sampled voltage of the positive input signal $V_{inp}$. The capacitor 304, implemented according to the predetermined capacitance, is used to hold one voltage selected from a group consisting of a positive reference voltage $V_{refp}$, a negative reference voltage $V_{refn}$ and the output common mode reference ground. The second capacitor, composed of capacitors 305 and 306, both implemented according to the predetermined capacitance, is used to hold a sampled voltage of the negative input signal $V_{inn}$. The capacitor 307, implemented according to the predetermined capacitance, is used to hold one voltage selected from a group consisting of the positive reference voltage $V_{refp}$, the negative reference voltage $V_{refn}$ and the output common mode reference ground. The capacitor 325, implemented according to the predetermined capacitance, is used to provide a dump load for the positive reference voltage $V_{refp}$ when the output voltage of the multiplexer 323 and the output voltage of the multiplexer 324 both connect to the output common mode reference ground. The capacitor 331, implemented according to the predetermined capacitance, is used to provide a dump load for the negative reference voltage $V_{refn}$ when the output voltage of the multiplexer 323 and the output voltage of the multiplexer 324 both connect to the output common mode reference ground.

The twelve sampling phase switches 308~315, 326~327 and 332~333 are implemented to function during the sampling phase as follows. The switches 308 and 309 are used to sample the positive input signal $V_{inp}$ into the capacitors 302 and 303. The switch 310 is used to connect the bottom plate of the capacitor 304 to an input common mode reference ground and the switch 311 is used to connect the top plate of the capacitor 304 to the output of the multiplexer 323. The switches 312 and 313 are used to sample the negative input signal $V_{inn}$ into the capacitors 305 and 306. The switch 314 is used to connect the bottom plate of the capacitor 307 to the input common mode reference ground and the switch 315 is used to connect the top plate of the capacitor 307 to the output of the multiplexer 324. The switch 326 is used to connect the bottom plate of the capacitor 325 to the input common mode reference ground and the switch 327 is used to connect the top plate of the capacitor 325 to the output of the multiplexer 330. The switch 332 is used to connect the bottom plate of the capacitor 331 to the input common mode reference ground and the switch 333 is used to connect the top plate of the capacitor 331 to the output of the multiplexer 336.

The eleven charge transfer phase switches 316~322, 328~329 and 334~335 are implemented to function during the charge transfer phase as follows. The switch 316 is used to interconnect the top plates of the capacitors 302, 303, 305 and 306. The switch 317 is used to connect the bottom plates of the capacitors 302, 303 to the negative input end of the OTA 301. The switch 318 is used to connect the bottom plate of the capacitor 304 to the negative input end of the OTA 301. The switch 319 is used to connect the bottom plate of the capacitors 304 to the positive output end of the OTA 301. The switch 320 is used to connect the bottom plates of the capacitors 305 and 306 to the positive input end of the OTA 301. The switch 321 is used to connect the bottom plate of the capacitor 307 to the positive input end of the OTA 301. The switch 322 is used to connect the top plate of the capacitor 307 to the negative output end of the OTA 301. As a result, the capacitors 302~307 and the OTA 301 together form a negative feedback circuit to generate the residue output $V_{out}$ during the charge transfer phase. Besides, the switch 328 is used to connect the bottom plate of the capacitor 325 to the input common mode reference ground and the switch 329 is used to connect the top plate of the capacitor 325 to the output common mode reference ground. The switch 334 is used to connect the bottom plate of the capacitor 331 to the input common mode reference ground and the switch 335 is used to connect the top plate of the capacitor 331 to the output common mode reference ground.

The multiplexer 323 is used to provide a first multiplexer output voltage selected from a group consisting of the negative reference voltage $V_{refn}$, the positive reference voltage $V_{refp}$ and the output common mode reference ground according to two select signals bp&e and bn&e, wherein bp&e is logic-AND of a positive bit signal bp and a clock signal e, and bn&e is logic-AND of a negative bit signal bn and the clock signal e, and the rising edge of the clock e is the breaking point of the first half period and the second half period of sampling phase. When bp&e=0 and bn&e=0, the first multiplexer output voltage is connected to the output common mode reference ground; when bp&e=0 and bn&e=1, the first multiplexer output voltage is connected to the positive reference voltage $V_{refp}$; and when bp&e=1 and bn&e=0, the first multiplexer output voltage is connected to the negative reference voltage $V_{refn}$. Therefore, the first multiplexer output voltage is connected to the output common mode reference ground during the first half period of sampling phase, and connected to one of the negative reference voltage $V_{refn}$, the positive reference voltage $V_{refp}$ and the output common mode reference ground according to the bp&e and bn&e during the second half period of sampling phase.

The multiplexer 324 is used to provide a second multiplexer output voltage selected from a group consisting of the negative reference voltage $V_{refn}$, the positive reference voltage $V_{refp}$ and the output common mode reference ground according to bp&e and bn&e. When bp&e=0 and bn&e=0, the second multiplexer output voltage is connected to the output common mode reference ground; when bp&e=0 and bn&e=1, the second multiplexer output voltage is connected to the negative reference voltage $V_{refn}$; and when bp&e=1 and bn&e=0, the second multiplexer output voltage is connected to the positive reference voltage $V_{refp}$. Therefore, the second multiplexer output voltage is connected to the output common mode reference ground during the first half period of sampling phase, and connected to one of the negative reference voltage $V_{refn}$, the positive reference voltage $V_{refp}$ and the output common mode reference ground according to the bp&e and bn&e during the second half period of sampling phase.

The multiplexer 330 is used to provide a third multiplexer output voltage selected from a group consisting of the positive reference voltage $V_{refp}$ and the output common mode reference ground according to a select signal e&~(bp+bn). When e&~(bp+bn)=0, the third multiplexer output voltage is connected to the output common mode reference ground; when e&~(bp+bn)=1, the third multiplexer output voltage is connected to the positive reference voltage $V_{refp}$. Therefore, the third multiplexer output voltage is connected to the output common mode reference ground during the first half period of sampling phase, and connected to one of the positive reference voltage $V_{refp}$ and the output common mode reference ground according to the e&~(bp+bn) during the second half period of sampling phase.

The multiplexer 336 is used to provide a fourth multiplexer output voltage selected from a group consisting of the negative reference voltage $V_{refn}$ and the output common mode reference ground according to a select signal e&~(bp+bn). When e&~(bp+bn)=0, the fourth multiplexer output voltage is connected to the output common mode reference ground; when e&~(bp+bn)=1, the fourth multiplexer output voltage is connected to the negative reference voltage $V_{refn}$. Therefore, the fourth multiplexer output voltage is connected to the output common mode reference ground during the first half period of sampling phase, and connected to one of the negative reference voltage $V_{refp}$ and the output common mode reference ground according to the e&~(bp+bn) during the second half period of sampling phase.

The comparator 337, having a first positive comparing input end, a first negative comparing input end and a first comparing output end, is used to generate the positive bit signal bp according to voltage comparison of the input signal $V_{in}$ and a first reference voltage $V_{ref}/4$ at the rising edge of the clock e, wherein the $V_{ref}$ is equal to the voltage difference between the $V_{refp}$ and the $V_{refn}$. The comparator 338, having a second positive comparing input end, a second negative comparing input end and a second comparing output end, is used to generate the negative bit signal bn according to voltage comparison of the input signal $V_{in}$ and a second reference voltage $-V_{ref}/4$ at the rising edge of the clock e, wherein (bp, bn) is (0,0) when $V_{in}$ is between $-V_{ref}/4$ and $V_{ref}/4$; (bp, bn) is (0,1) when $V_{in}$ is smaller than $-V_{ref}/4$; and (bp, bn) is (1,0) when $V_{in}$ is greater than $V_{ref}/4$.

The voltage reference buffer 339 is used to provide the $V_{refp}$ and the $V_{refn}$, and the voltage reference buffer 339 can be an OTA or a low output impedance amplifier.

Figure 4A:
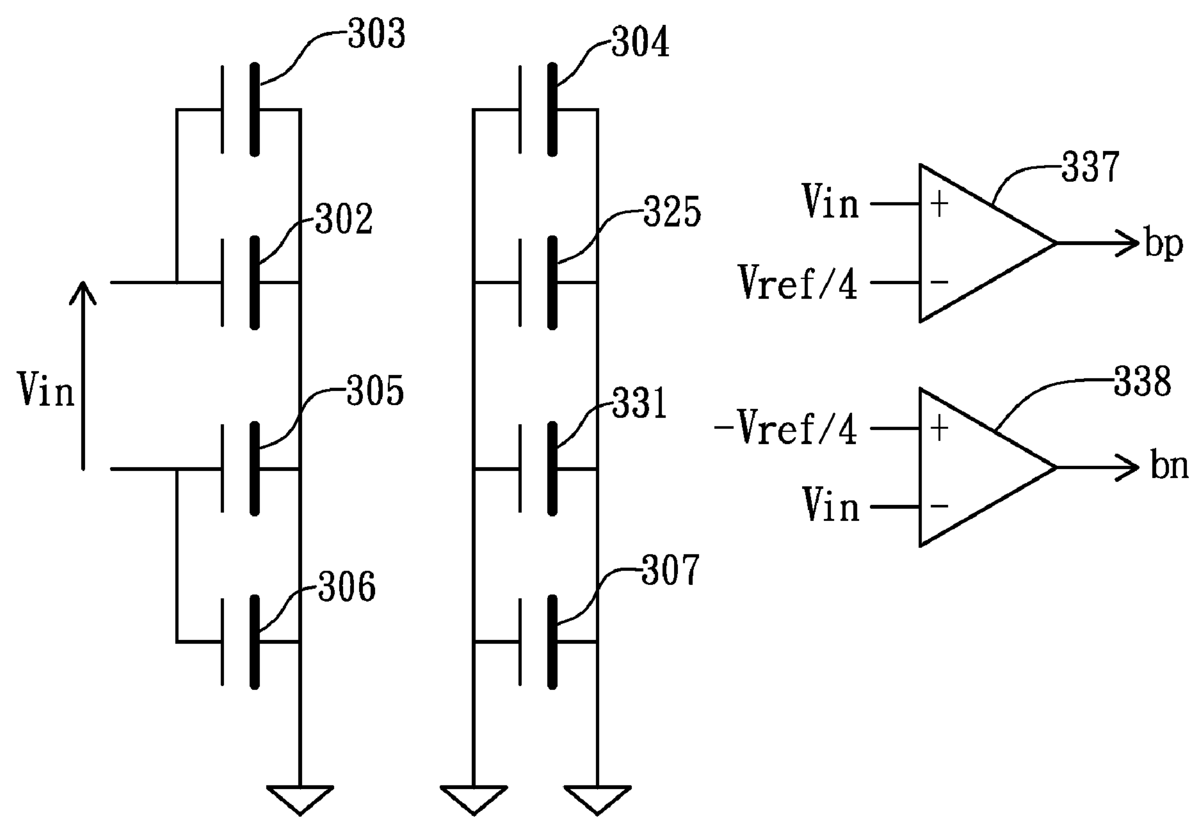
FIG. 4*a* is an illustrating diagram of a first half period of sampling phase of the 1-bit cell in FIG. 3.
Figure 4B:
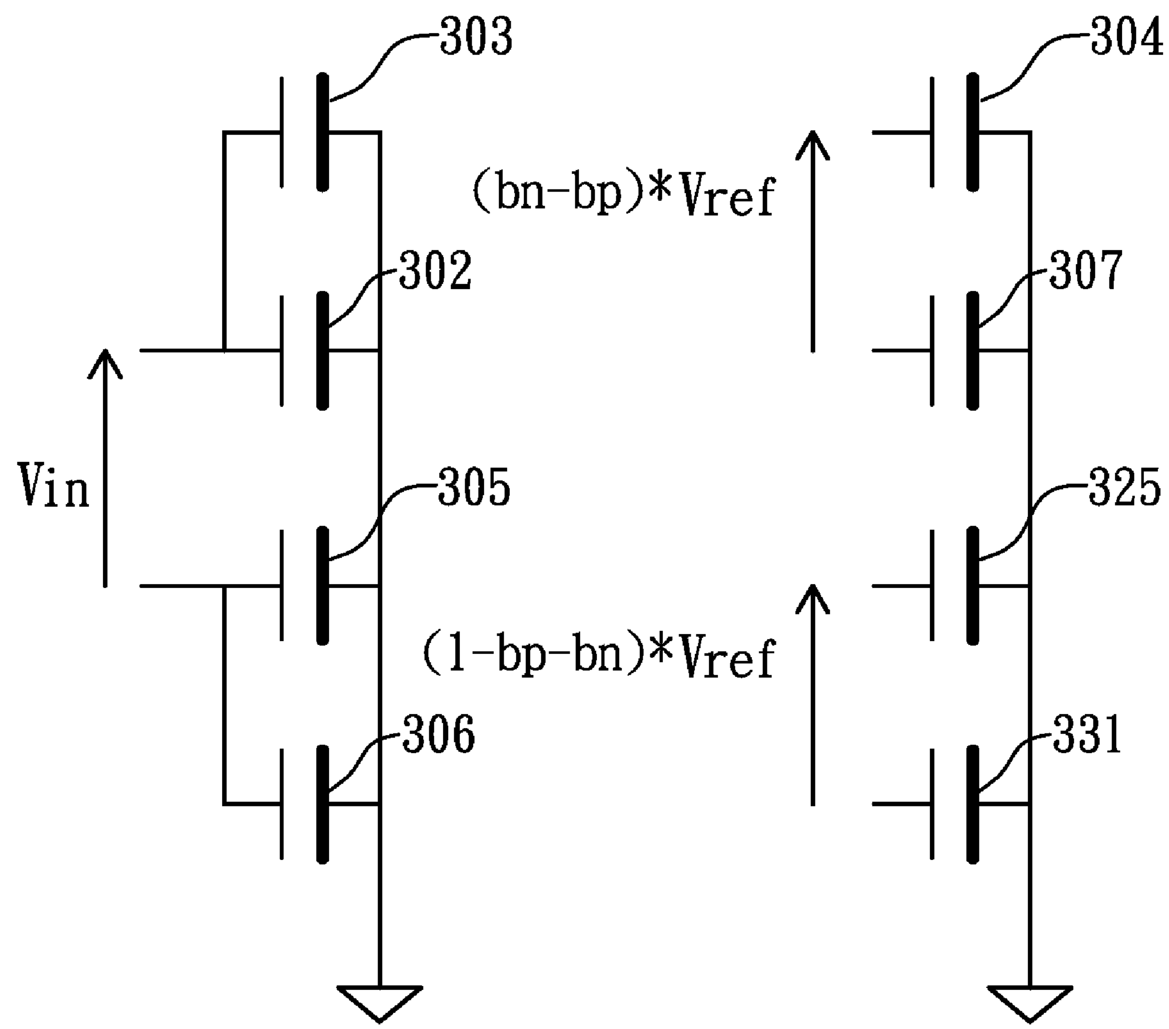
FIG. 4*b* is an illustrating diagram of a second half period of sampling phase of the 1-bit cell in FIG. 3.
Figure 4C:
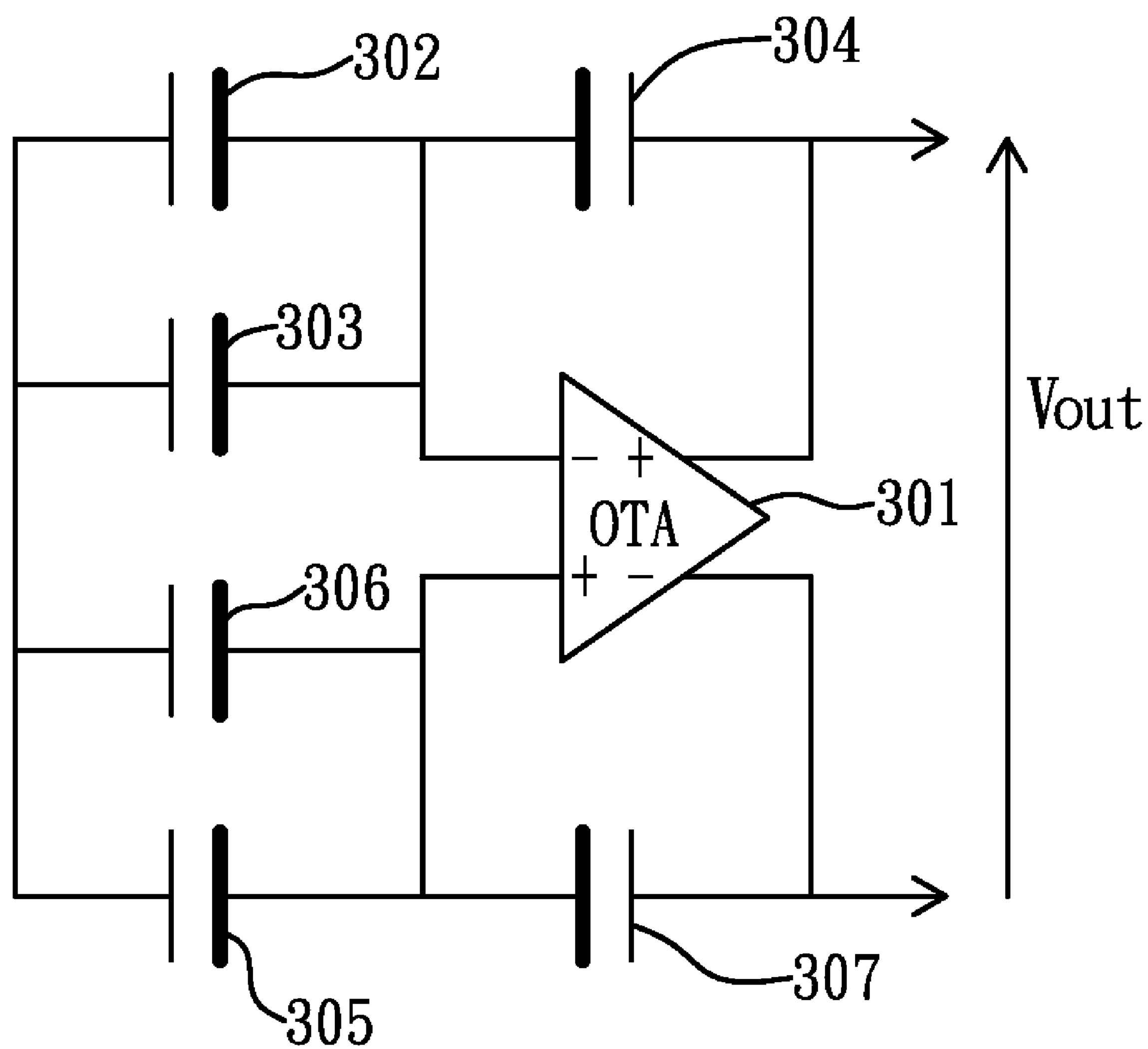
FIG. 4*c* is an illustrating diagram of a charge transfer phase of the 1-bit cell in FIG. 3.

The configurations of the first half period of sampling phase, the second half period of sampling phase and the charge transfer phase of the 1-bit cell circuit according to a preferred embodiment of the present invention is shown in FIG. 4*a*~*c*. Please refer to FIG. 4*a*, which shows an illustrating diagram of the first half period of sampling phase of the 1-bit cell in FIG. 3. As shown in FIG. 4*a*, the top plates of the capacitors 302 and 303 are connected to the positive terminal of the $V_{in}$, and the top plates of the capacitors 305 and 306 are connected to the negative terminal of the $V_{in}$, and all the bottom plates of the capacitors 302, 303, 305 and 306 are connected to the input common mode reference ground. The bottom plates of the capacitors 304, 307 are connected to the input common mode reference ground, and the top plate of the capacitor 304 is connected to a first reference contact, which is the output of the multiplexer 323, being connecting to the output common mode reference ground according to the bp&e and bn&e during the first half period of sampling phase, and the top plate of the capacitor 307 is connected to a second reference contact, which is the output of the multiplexer 324, being connecting to the output common mode reference ground according to the bp&e and bn&e during the first half period of sampling phase. The bottom plates of the capacitor 325, 331 are connected to the input common mode reference ground, and the top plates of the capacitors 325, 331 are respectively connected to the output ends of the multiplexer 330, 336, being both connecting to the output common mode reference ground according to the e&~(bp+bn). The comparator 337 generates the positive bit signal bp and the comparator 338 generates the negative bit signal bn at the end of the first half period of sampling phase.

FIG. 4*b* shows an illustrating diagram of the second half period of sampling phase of the 1-bit cell in FIG. 3. As shown in FIG. 4*b*, the top plates of the capacitors 302 and 303 are connected to the positive terminal of the $V_{in}$, and the top plates of the capacitors 305 and 306 are connected to the negative terminal of the $V_{in}$, and all the bottom plates of the capacitors 302, 303, 305 and 306 are connected to the input common mode reference ground. The top plate of the capacitor 304 is connected to the first reference contact, which is the output of the multiplexer 323, being connecting to one of the negative reference voltage $V_{refn}$, the positive reference voltage $V_{refp}$ and the output common mode reference ground according to the bp&e and bn&e. The top plate of the capacitor 307 is connected to the second reference contact, which is the output of the multiplexer 324, being connecting to one of the negative reference voltage $V_{refn}$, the positive reference voltage $V_{refp}$ and the output common mode reference ground according to the bp&e and bn&e. The voltage difference between the top plates of the capacitor 304 and 307 is therefore equal to a first differential voltage $(bn-bp)*V_{ref}$. The bottom plate of the capacitor 325 is connected to the input common mode reference ground and the top plate of the capacitors 325 is connected to the output of the multiplexer 330, which is connected to one of the positive reference voltage $V_{refp}$ and the output common mode reference ground according to the e&~(bp+bn). The bottom plate of the capacitor 331 is connected to the input common mode reference ground and the top plate of the capacitors 331 is connected to the output of the multiplexer 336, which is connected to one of the negative reference voltage $V_{refn}$ and the output common mode reference ground according to the e&~(bp+bn). The voltage difference between the top plates of the capacitor 325 and 331 is therefore equal to a second differential voltage $(1-bn-bp)*V_{ref}$. It can be proven that the sum of the absolute value of the first differential voltage $(bn-bp)*V_{ref}$ and the absolute value of the second differential voltage $(1-bn-bp)*V_{ref}$ is equal to $V_{ref}$ no matter what the (bp,bn) may be.

FIG. 4*c* shows an illustrating diagram of the charge transfer phase of the 1-bit cell in FIG. 3. During the charge transfer phase, the top plates of the capacitors 302~303, 305~306 are connected together, and the bottom plates of the capacitors 302~303 are connected to the negative input end of the OTA 301, and the bottom plates of the capacitors 305~306 are connected to the positive input end of the OTA 301; the bottom plate of the capacitor 304 is connected to the negative input end of the OTA 301, and the top plate of the capacitor 304 is connected to the positive output end of the OTA 301, and the bottom plate of the capacitor 307 is connected to the positive input end of the OTA 301, and the top plate of the capacitor 307 is connected to the negative output end of the OTA 301; and the bottom plates of the capacitor 325, 331 are connected to the input common mode reference ground and the top plates of the capacitor 325, 331 are connected to the output common mode reference ground. In this phase, the $V_{ref}$ is not used, and due to the virtual ground of the OTA 301 in negative feedback, the charge in the capacitors 302~307 will be redistributed to generate the residue output $V_{out}=2\times V_{in}-(bp-bn)\times V_{ref}$.

Figure 5:
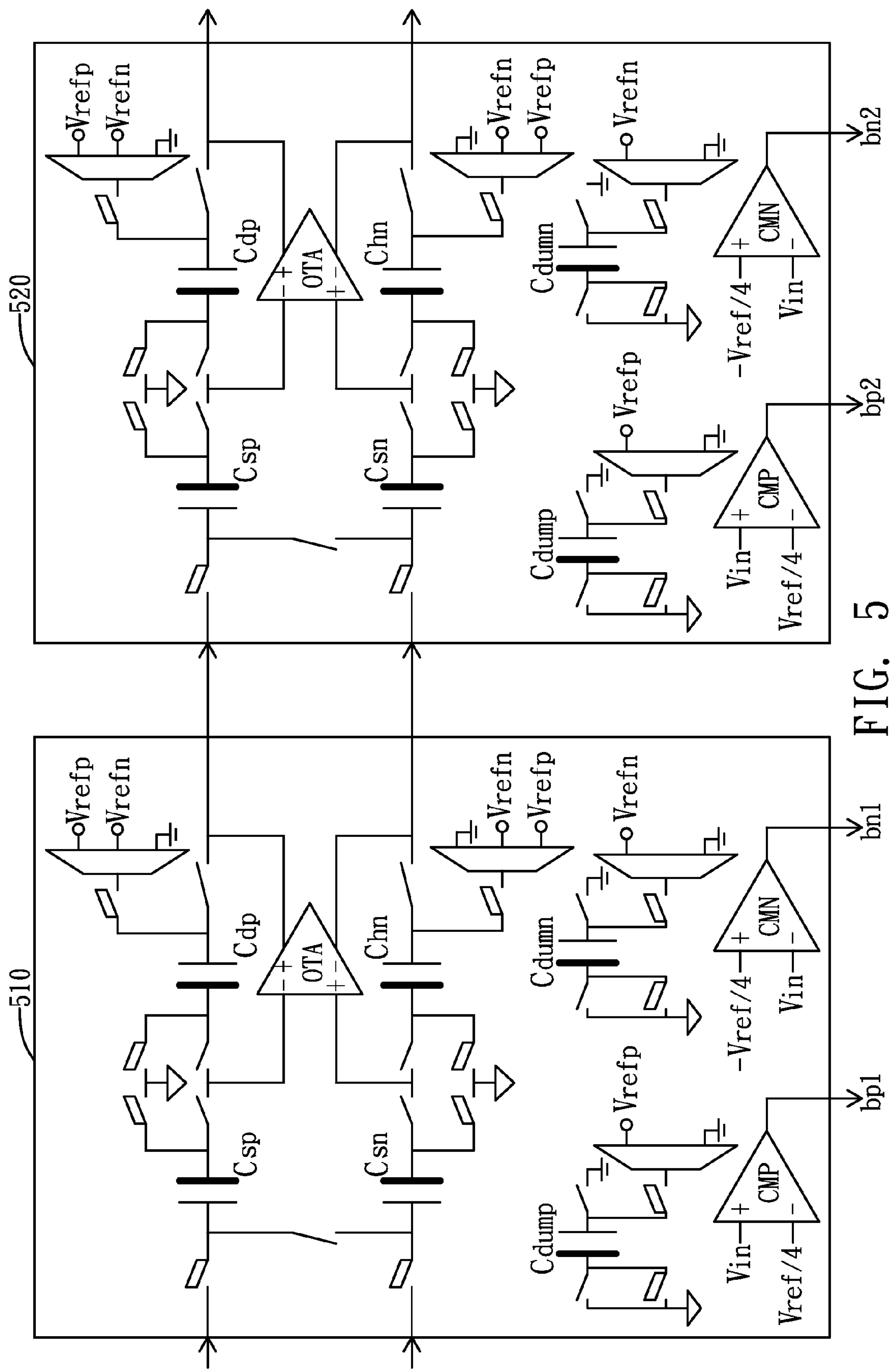
FIG. 5 is a circuit diagram of a cascade of two 1-bit cells according to a preferred embodiment of the present invention.

Please refer to FIG. 5, which shows a circuit diagram of a cascade of two 1-bit cells in a pipelined ADC according to a preferred embodiment of the present invention. As shown in FIG. 5, the residue output of a 1-bit cell 510 is connected to the input of a 1-bit cell 520, and the 1-bit cell 510 generates a positive bit signal bp1 and a negative bit signal bn1, and the 1-bit cell 520 generates a positive bit signal bp2 and a negative bit signal bn2. In an n-bit pipelined converter with resolution n>2, there will be at each clock phase more than one cell using the reference voltage (if n is even, there will be always n/2 cells using the reference voltage; if n is odd, there will be alternately (n+1)/2 and (n−1)/2 cells using the reference voltage). In the second half period of all clock phases, $V_{ref}$ is not used at all, i.e., not used by the cell 510 (and all other odd cells not depicted), nor by the cell 520 (and all other even cells not depicted). This allows the reference voltage to be shared with another set of cells operated with half a clock phase delay, to build a 4× time-interleaved ADC. This feature cannot be achieved in the prior art implementation, not really because the reference voltage is used for the complete duration of each clock period, but rather because of the cascade settling of the reference buffer and OTA in each 1-bit cell. For example, if, at the half instance of a clock phase, a new extra load is suddenly connected to the reference buffer, a resulted glitch will propagate to all the 1-bit cells currently in settling, that will significantly delay their final settling. As a matter of fact, the novel implementation of the present invention uses the reference voltage only for half the duration of each clock phase, while the maximal current (or load) sunk from the reference voltage is staying the same. This fact, together with the relaxed requirement on the reference settling, makes the 4× time-interleaved ADC possible.

In summary, according to the present invention, the positive reference voltage $V_{refp}$ has a load capacitor with constant initial charge no matter what bp and bn may be during the second half period of sampling phase, and the load capacitor can be the capacitor 304 when bp&e=0 and bn&e=1, or be the capacitor 307 when bp&e=1 and bn&e=0, or be the capacitor 325 when bp&e=0 and bn&e=0 (i.e., e&~(bp+bn)=1); and the negative reference voltage $V_{refn}$ has a load capacitor with constant initial charge no matter what bp and bn may be during the second half period of sampling phase, and the load capacitor can be the capacitor 307 when bp&e=0 and bn&e=1, or be the capacitor 304 when bp&e=1 and bn&e=0, or be the capacitor 331 when bp&e=0 and bn&e=0 (i.e., e&~(bp+bn)=1).

As a result, the sum of the absolute value of a first differential voltage, which is the voltage difference between the first multiplexer output voltage and the second multiplexer output voltage, and the absolute value of a second differential voltage, which is the voltage difference between the third multiplexer output voltage and the fourth multiplexer output voltage, is equal to a settling voltage of the reference voltage $V_{ref}$ at the end of the second half period of sampling phase, wherein the reference voltage $V_{ref}$ is the voltage difference between the positive reference voltage $V_{refp}$ and the negative reference voltage $V_{refn}$. The capacitors 325 and 331 therefore serve as a dump circuit for the positive reference voltage $V_{refp}$ and the negative reference voltage $V_{refn}$ respectively when the capacitors 304 and 307 are isolated from the positive reference voltage $V_{refp}$ and the negative reference voltage $V_{refn}$ by the multiplexers 323 and 324 in the case of (bp, bn)=(0,0).

Therefore, a novel 1-bit cell according to the present invention is proposed. The novel 1-bit cell ensures that the amount of charges provided by the reference buffer in each clock period is not dependent on the signal currently converted. Besides, assuming that the clock has achieved the minimal jitter required for aperture noise concerns on high frequency input signal, the novel 1-bit cell ensures both a constant load and a constant settling time for the reference buffer to have a constant settling, even if incomplete, whereas, with a load depending on input signal, full settling is the only way to guaranty a constant final value. Furthermore, it is known that the group delay of a 1-bit cell is critical for the data rate of a pipelined converter in that a shorter group delay will result in a higher data rate, and also critical for the total conversion delay, the time elapsed between signal sampling and full n-bit code delivery, which is of extreme importance in some application like AGC (Automatic Gain Control) or other closed loop systems. The 1-bit cell of the present invention preserves the fundamental 1-clock phase group delay, i.e., a new residue output is delivered to the next cell exactly one clock phase after an old residue was sampled from the previous cell, so it can offer a smallest group delay, a smallest total conversion delay and therefore a high data rate. The present invention thus possesses the following advantages. First, the settling voltage of the second pair of capacitors needs not equal to the reference voltage $V_{ref}$, so the speed requirement on the reference buffer can be relaxed, and the power needed by the reference buffer is thereby reduced. Second, since during the second half period of sampling phase the voltage reference $V_{ref}$ always has a pair of capacitors implemented according to a predetermined capacitance, and the pair of capacitors being with constant initial charge, the total charge supplied by the voltage reference $V_{ref}$ is therefore constant, i.e. independent of the input signal. Even though there exists mismatch between the capacitors, for example, ~0.1%, the variation of the charge taken from the voltage reference $V_{ref}$ will be ~0.1%×the predetermined capacitance×$V_{ref}/2$, much smaller than the 0.75×Cs×$V_{ref}/2$ of the prior art. This ensures a constant value to the final output voltage of the reference buffer, and thus avoids any samples interference of the input signal and greatly improves the linearity of the ADC operation. Third, compared to the prior art 1-bit cell circuit, the settling of the reference buffer is not interfering with the setting of the OTA's (no cascade setting), and thereby avoids any slow down of each cell settling. Fourth, since the reference buffer is only used half the time, it can, within same power, be shared by one more ADC time-shifted by half a clock cycle to build a 4× interleaved ADC even if scaling down design is progressively applied from $1^{st}$ (MSB) to last (LSB) cells for optimal power and area concerns. Finally, the novel design of the 1-bit cell of the present invention offers the signal independent loading of the reference voltage with only 1-clock phase group delay.

Through the implementation of the 1-bit cell circuit used in pipelined ADCs according to a preferred embodiment of the present invention, a novel pipelined ADC is presented. The topology of the present invention saves much more power than prior art circuits and can be utilized to build a 4× interleaved ADC, so the contribution of the present invention is indeed worthy of the grant of a patent.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance than the conventional structure and further complies with the patent application requirements and is submitted to the Patent and Trademark Office for review and granting of the commensurate patent rights.

What is claimed is:

1. A 1-bit cell circuit used in a pipelined analog to digital converter, having a sampling phase including a first half period and a second half period and a charge transfer phase in a cycle, the 1-bit cell circuit comprising:

a differential amplifier, having a positive input end, a negative input end, a positive output end and a negative output end, for outputting a residue output signal;

a first capacitor, having a first plate and a second plate, and a second capacitor, having a third plate and a fourth plate, wherein said first plate is connected to a positive input signal, said third plate is connected to a negative input signal, and said second plate and said fourth plate are both connected to an input common mode reference ground during said sampling phase, and said first plate is connected to said third plate, said second plate is connected to said negative input end of said differential amplifier, and said fourth plate is connected to said positive input end of said differential amplifier during said charge transfer phase; and a third capacitor, having a fifth plate and a sixth plate, and a fourth capacitor, having a seventh plate and an eighth plate, wherein said fifth plate and said seventh plate are connected to an output common mode reference ground, and said sixth plate and said eighth plate are both connected to said input common mode reference ground during said first half period of said sampling phase; said fifth plate is connected to a first reference contact, said seventh plate is connected to a second reference contact, and said sixth plate and said eighth plate are both connected to said input common mode reference ground during said second half period of said sampling phase; and said fifth plate is connected to said positive output end of said differential amplifier, said sixth plate is connected to said negative input end of said differential amplifier, said seventh plate is connected to said negative output end of said differential amplifier and said eighth plate is connected to said positive input end of said differential amplifier during said charge transfer phase;

wherein voltages of said first reference contact and said second reference contact are determined according to an input voltage and a reference voltage, and said input voltage is a voltage difference between said positive input signal and said negative input signal.

2. The 1-bit cell circuit as claim 1, further comprising:

a first multiplexer and a second multiplexer for respectively selecting one of a positive reference voltage, a negative reference voltage and an output common mode voltage of said output common mode reference ground to couple to the first reference contact and the second reference contact according to said input voltage and said reference voltage.

3. The 1-bit cell circuit as claim 2, wherein said positive reference voltage is selected to couple to said second reference contact and said negative reference voltage is selected to couple to said first reference contact when said input voltage is lager than positive one fourth of said reference voltage, and said positive reference voltage is selected to couple to said first reference contact and said negative reference voltage is selected to couple to said second reference contact when said input voltage is less than negative one fourth of said reference voltage, and said output common mode voltage is selected to couple to both of said first reference contact and said second reference contact when said input voltage is between positive one fourth of said reference voltage and negative one fourth of said reference voltage.

4. The 1-bit cell circuit as claim 3, further comprising:

a fifth capacitor, having a ninth plate and a tenth plate, wherein said ninth plate is connected to said input common mode reference ground and said tenth plate is connected to said positive reference voltage when said input voltage is between positive one fourth of said reference voltage and negative one fourth of said reference voltage, otherwise said tenth plate is connected to said output common mode voltage; and a sixth capacitor, having an eleventh plate and a twelfth plate, wherein said eleventh plate is connected to said input common mode reference ground and said twelfth plate is connected to said negative reference voltage when said input voltage is between positive one fourth of said reference voltage and negative one fourth of said reference voltage, otherwise said twelfth plate is connected to said output common mode reference ground;

wherein said third capacitor, said fourth capacitor, said fifth capacitor and said sixth capacitor are implemented according to a capacitance.

5. The 1-bit cell circuit as claim 4, further comprising:

a reference buffer for providing said positive reference voltage and said negative reference voltage.

6. The 1-bit cell circuit as claim 5, wherein the reference buffer is shared by another 1-bit cell circuit used in said pipelined analog to digital converter.

7. The 1-bit cell circuit as claim 2, further comprising:

a first comparator, having a first positive comparing input end, a first negative comparing input end and a first comparing output end, for comparing said input voltage with a first threshold voltage to generate a positive bit signal, wherein said input voltage is coupled to said first positive comparing input end and said first threshold voltage is coupled to said first negative comparing input end; and a second comparator, having a second positive comparing input end, a second negative comparing input end and a second comparing output end, for comparing said input voltage with a second threshold voltage to generate a negative bit signal, wherein said input voltage is coupled to said second negative comparing input end and said second threshold voltage is coupled to said second positive comparing input end.

8. The 1-bit cell circuit as claim 7, wherein said first threshold voltage is one fourth of the reference voltage, and said second threshold voltage is negative one fourth of the reference voltage, and the reference voltage is the difference between said positive reference voltage and said negative reference voltage.

9. A 1-bit cell circuit used in a pipelined analog to digital converter, having a sampling phase including a first half period and a second half period and a charge transfer phase in a cycle, the 1-bit cell circuit comprising:

a differential amplifier, having a pair of differential input ends and a pair of differential output ends, for outputting a differential residue output signal;

a first pair of capacitors, having a pair of first top plates and a pair of first bottom plates, wherein said pair of first top plates are connected to a differential input signal, and said first bottom plates are connected to an input common mode reference ground during said sampling phase, and said first top plates are connected to each other and said first bottom plates are connected to said differential input ends of said differential amplifier during said charge transfer phase; and a second pair of capacitors, having a pair of second top plates and a pair of second bottom plates, wherein said second top plates are connected to an output common mode reference ground and said second bottom plates are connected to an input common mode reference ground during said first half period of said sampling phase; said second top plates are connected to a pair of reference contacts and said second bottom plates are connected to said input common mode reference ground during said second half period of said sampling phase; and said second top plates are connected to said differential output ends of said differential amplifier and said second bottom plates are connected to said differential input ends of said differential amplifier during said charge transfer phase;

wherein voltages of said reference contacts are determined according to an input voltage of said differential input signals and a reference voltage.

10. The 1-bit cell circuit as claim 9, the circuit further comprising:

a pair of multiplexers for respectively selecting one of a positive reference voltage, a negative reference voltage and an output common mode voltage of said output common mode reference ground to couple to said reference contacts according to said input voltage and said reference voltage.

11. The 1-bit cell circuit as claim 10, further comprising:

a third pair of capacitors, having a pair of third top plates and a pair of third bottom plates, wherein said third bottom plates are connected to said input common mode reference ground and said third top plates are respectively connected to said positive reference voltage and said negative reference voltage when said input voltage is between positive one fourth of said reference voltage and negative one fourth of said reference voltage, otherwise said third top plates are both connected to said output common mode voltage;

wherein said second pair of capacitors and said third pair of capacitors are implemented according to a capacitance.

12. The 1-bit cell circuit as claim 11, further comprising:

a reference buffer for providing said positive reference voltage and said negative reference voltage.

13. A 1-bit cell circuit used in a pipelined analog to digital converter, the 1-bit cell circuit comprising:

a reference buffer for providing a reference voltage;

a sample and charge transfer circuit for receiving an input signal to generate an output signal; and a dump circuit for dumping said reference voltage;

wherein said reference buffer selectively connects to one of said sample and charge transfer circuit and said dump circuit according to said input signal.

14. The 1-bit cell circuit as claim 13, having a sampling phase including a first half period and a second half period and a charge transfer phase in a cycle, wherein said sample and charge transfer circuit comprising;

a differential amplifier, having a pair of differential input ends and a pair of differential output ends, for outputting said output signal;

a first pair of capacitors, having a pair of first top plates and a pair of first bottom plates, wherein said first top plates are connected to said input signal, and said first bottom plates are connected to a reference ground during said sampling phase, and said first top plates are connected to each other and said first bottom plates are connected to said differential input ends of said differential amplifier during said charge transfer phase; and a second pair of capacitors, having a pair of second top plates and a pair of second bottom plates, wherein said second top plates are connected to an output common mode reference ground and said second bottom plates are connected to an input common mode reference ground during said first half period of said sampling phase; said second top plates are connected to a pair of reference contacts and said second bottom plates are connected to said input common mode reference ground during said second half period of said sampling phase; and said second top plates are connected to said differential output ends of said differential amplifier and said second bottom plates are connected to said differential input ends of said differential amplifier during said charge transfer phase;

wherein voltages coupled to said reference contacts are determined according to an input voltage of said input signal and said reference voltage.

15. The 1-bit cell circuit as claim 14, wherein said dump circuit comprises:

a third pair of capacitors, having a pair of third top plates and a pair of third bottom plates, wherein said third bottom plates are connected to said input common mode reference ground and said third top plates are connected to said reference buffer when said second top plates are not connected to said reference buffer during said second half period of said sampling phase;

wherein said second pair of capacitors and said third pair of capacitors are implemented according to a capacitance.

* * * * *